(12) United States Patent
Yoon et al.

(10) Patent No.: US 9,847,288 B2
(45) Date of Patent: Dec. 19, 2017

(54) SEMICONDUCTOR HAVING PROTECTIVE LINES

(71) Applicant: SK hynix Inc., Gyeonggi-do (KR)

(72) Inventors: Young Hee Yoon, Gyeonggi-do (KR); Bum Su Kim, Chungcheongbuk-do (KR); Yung Bog Yoon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/182,111

(22) Filed: Jun. 14, 2016

(65) Prior Publication Data

US 2017/0213789 A1    Jul. 27, 2017

(30) Foreign Application Priority Data

Jan. 22, 2016  (KR) .......................... 10-2016-0008106

(51) Int. Cl.
*H04B 3/28* (2006.01)
*H01L 23/522* (2006.01)
*H01L 23/528* (2006.01)

(52) U.S. Cl.
CPC ...... *H01L 23/5225* (2013.01); *H01L 23/5283* (2013.01)

(58) Field of Classification Search
CPC .................... H01L 23/5225; H01L 23/5283
USPC ........................................... 333/132
See application file for complete search history.

(56) References Cited

U.S. PATENT DOCUMENTS 6,664,638 B2    12/2003  Ushiyama et al.
6,961,915 B2 *  11/2005  Loh .................. G06F 17/5068
                                               257/773

FOREIGN PATENT DOCUMENTS

KR     1020020050090        6/2002

* cited by examiner

*Primary Examiner* — Robert Pascal
*Assistant Examiner* — Kimberly Glenn
(74) *Attorney, Agent, or Firm* — IP & T Group LLP

(57) ABSTRACT

A semiconductor device includes a signal transmission line extending in a first direction; an outer protective line extending in a substantially identical direction as the first direction and spaced apart from the signal transmission line by a predetermined distance along a second direction which is substantially perpendicular to the first direction; and an inner protective line, disposed between the outer protective line and the signal transmission line, and intermittently extending substantially in parallel with said signal transmission line and outer protective line.

8 Claims, 5 Drawing Sheets

SEMICONDUCTOR HAVING PROTECTIVE LINES

CROSS-REFERENCE TO RELATED APPLICATION

The present application claims priority under 35 U.S.C. §119(a) to Korean patent application No. 10-2016-0008106 filed on 22 Jan. 2016, which is hereby incorporated in its entirety by reference.

BACKGROUND

Embodiments of the present disclosure relate to a semiconductor device.

Typically, a semiconductor device includes a plurality of lines configured to transmit various signals, for example, in the form of voltages. As the integration degree of a semiconductor device increases, a distance between these lines is reduced, which may cause interference between the lines.

SUMMARY

Various embodiments of the present disclosure are directed to providing a semiconductor device that substantially obviates one or more problems and disadvantages of the related art.

An embodiment of the present disclosure relates to a semiconductor device for minimizing interference between connection lines so as to more correctly transmit a significant signal value.

An embodiment of the present disclosure relates to a semiconductor device for reducing capacitive coupling between connection lines so as to minimize a time consumed for transmission of normal signals, resulting in increased operation speed of the semiconductor device.

It is to be understood that both the foregoing general description and the following detailed description of embodiments are exemplary and explanatory.

DETAILED DESCRIPTION

Reference will now be made in detail to embodiments of the present disclosure, examples of which are illustrated in the accompanying drawings. Wherever possible, the same reference numbers will be used throughout the drawings to refer to the same or like parts.

In association with the embodiments of the present disclosure, specific structural and functional descriptions are disclosed only for illustrative purposes. The embodiments of the present disclosure can be implemented in various ways without departing from the scope or spirit of the present disclosure.

In the description of the present disclosure, the terms "first," "second" and the like may be used to distinguish one component from another component, but the components are not limited by these terms. Hence, for example, a first component may be called a second component and a second component may be called a first component without departing from the scope of the present disclosure.

The terms used in the present application are merely used to describe specific embodiments and are not intended to limit the present disclosure. A singular expression may include a plural expression unless otherwise stated in the context.

Unless otherwise defined, all terms used herein, including technical or scientific terms, have the same meanings as understood by those skilled in the art. Terms defined in a generally used dictionary may be analyzed to have the same meaning as the context of the relevant art and may not be analyzed to have ideal meaning or excessively formal meaning unless clearly defined in the present application. The terminology used in the present disclosure is for the purpose of describing particular embodiments only and is not intended to limit the disclosure.

Figure 1:
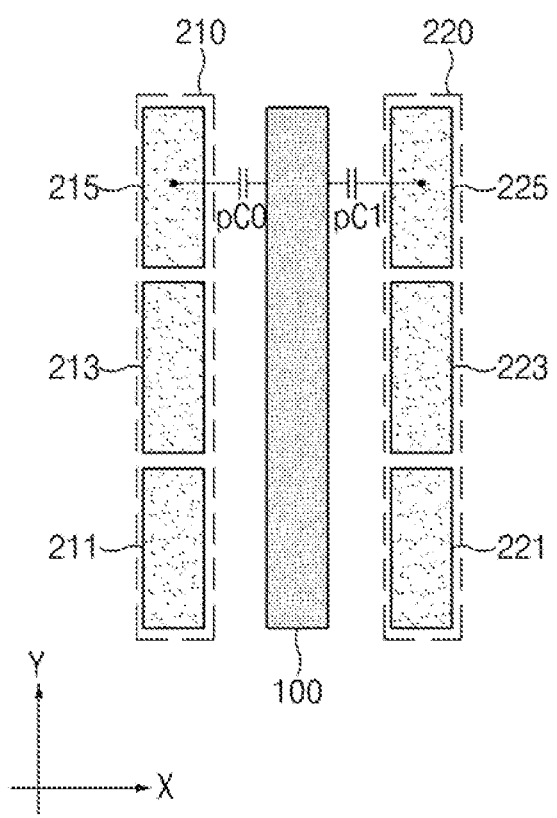
FIGS. 1, 2, 4, and 5 are plan views illustrating semiconductor devices, according to embodiments of the present disclosure.

FIG. 1 is a plan view illustrating a semiconductor device, according to an embodiment of the present disclosure.

According to the embodiment of FIG. 1, a semiconductor device 10a includes a signal transmission line 100 and first and second protective lines 210 and 220.

The signal transmission line 100 extends in a Y-axis direction over a semiconductor substrate. The signal transmission line 100 has a predetermined length in the Y-axis direction.

The signal transmission line 100 is formed of a conductive material. The signal transmission line 100 may transmit a signal, for example a clock signal or data in a single direction.

The signal transmission line 100 is located adjacent to other either neighboring signal transmission lines or other lines providing another voltage, (not shown). Such arrangement may cause formation of capacitive coupling components depending upon the proximity of the lines and the magnitude of the transmitted signals. For example, if the capacitance of the capacitive coupling components becomes greater than a certain threshold value, signals may be incompletely transmitted through the signal transmission line 100.

To prevent this phenomenon, while allowing close packing of the transmission lines, the present invention, employs the first and second protective lines 210 and 220 which are located adjacent on either side of the signal transmission line 100. First and second protective lines 210 and 220 extend in the Y direction, substantially in parallel with the transmission line 100, and are spaced apart from the signal transmission line 100 at a regular, predetermined interval along the X axis. The X axis is perpendicular to the Y axis. The first and second protective lines 210 and 220 may include metal.

The first and second protective lines 210 and 220 are floated. Hence, formation of capacitive coupling components pC0 and pC1 between the signal transmission line 100 and the first and second protective lines 210 and 220 is either completely or substantially prevented. Stated, otherwise, the capacitive coupling components pC0 and pC1 between the signal transmission line 100 and the first and second protective lines 210 and 220 are not substantially present. Accordingly, the capacitive coupling component of the signal transmission line 100 is minimized. In the illustrated embodiment of FIG. 1, the first and second protective lines 210 and 220 extend intermittently in the Y-axis direction, whereas the signal transmission line 100 extends continuously in the Y-axis direction. Hence, each of the first and second protective lines 210 and 220 includes a plurality of individual, separate elements which extend successively in the Y-axis direction. The plurality of separate elements, will hereinafter be referred to as the first and second protective line elements 211 to 225. The first protective line elements 211 to 215 are being dispose on one side of the transmission line 100 whereas the second protective line elements 221 to 225 are being disposed on the other side of the transmission line 100.

In another embodiment (not shown), each of the first and second protective lines 210 and 220 is a single continuous elongated line extending in substantially the same direction as the Y-axis direction and spaced apart from the signal transmission line 100 by a predetermined distance in the X-axis direction.

In the Y-axis direction, the extension length of each of the first and second protective line elements 211 to 225 is shorter than the extension length of the signal transmission line 100.

Although no capacitive coupling component is present between the signal transmission line 100 and the first protective lines 210 and 220, there is a possibility of capacitive coupling components between the signal transmission line 100 and an adjacent, signal transmission line (or an adjacent electrical line).

Figure 2:
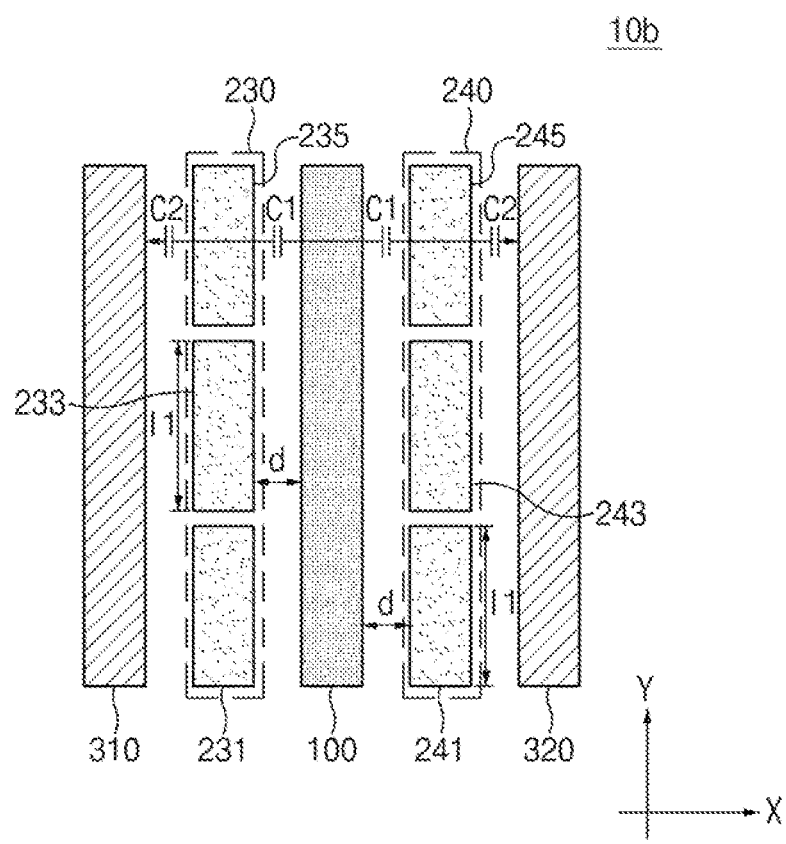

FIG. 2 is a plan view illustrating a semiconductor device, according to another embodiment of the present disclosure.

Referring to FIG. 2, the semiconductor device 10b may include a signal transmission line 100, first and second protective lines 230 and 240, and third and fourth protective lines 310 and 320.

When another electrical line, for example, another signal transmission line is located in the vicinity of the signal transmission line 100, capacitive coupling components may be present between the two conductive lines, and signals transferred through the signal transmission line 100 may be damaged or lost.

To prevent formation of such capacitive coupling components between transmission line 100 and an adjacent electrical line, the semiconductor device 10b, according to the embodiment of FIG. 2, includes, in addition to first and second intermittent first and second protective lines 231 and 241, third and fourth protective lines 310 and 320. The third and fourth protective lines 310 and 320 are spaced apart from the signal transmission line 100 by a predetermined distance in the X-axis direction, and are extended in substantially the same direction as the Y-axis direction in which the signal transmission line 100 is extended. The third protective line 310 is located at the left side of the signal transmission line 100, and the fourth protective line 320 is located at the right side of the signal transmission line 100.

An X-axis directional distance between the signal transmission line 100 and each of the third and fourth protective lines 310 and 320 may be longer than the X-axis directional distance between the signal transmission line 100 and each of the first and second protective lines 230 and 240. In the illustrated embodiment of FIG. 2, each of the third and fourth protective lines 310 and 320 is a continuous elongated line that has a Y-axis directional length substantially equal to that of the signal transmission line 100. However, in another embodiment, each of the third and fourth protective lines 310 and 320 may have a Y-axis directional length that is different from that of the signal transmission line 100.

The first protective line 230 extends in the Y-axis direction and includes a plurality of separate, first protective line elements 231 to 235. The second protective line 240 extends in the Y-axis direction and includes a plurality of separate, second protective line elements 241 to 245. Hence, each of the first and second protective elements 231 to 235 and 241 to 245 is shorter than the transmission line in the Y axis direction. Also, because of the gaps between the individual, first and second protective elements, the total length of each of the first and second protective lines 230 and 240 is shorter than the signal transmission line 100. In the illustrated embodiment the third and fourth protective lines 310 and 320 have the same length in the Y-axis direction as the transmission line 100. However, in an embodiment, the third and fourth protective lines 310 and 320 may have a different length in the Y-axis direction than the transmission line 100. When the lengths of the transmission line 100 and the length of the third and fourth protective lines 310 and 320 are different, the total length (without the gaps) of each of the first and second protective lines 230 and 240 may be less than at least one of the signal transmission line 100 and the third and fourth protective lines 310 and 320 in the Y-axis direction.

The first and second protective lines 230 and 240 may be floated as described above.

As illustrated in the embodiment of FIG. 2, in the Y-axis direction, the first and second protective lines 230 and 240 are symmetrical to each other on the basis of the signal transmission line 100. Likewise, the third and fourth protective lines 310 and 320 are symmetrical to each other on the basis of the signal transmission line 100. Hence, the separation distance between the third protective line 310 and the signal transmission line 100 is identical to a separation distance between the fourth protective line 320 and the signal transmission line 100. However, the invention is not limited to a symmetrical arrangement. For example, the separation distance between the third protective line 310 and the signal transmission line 100 may be different from a separation distance between the fourth protective line 320 and the signal transmission line 100.

A capacitive coupling component formed between the signal transmission line 100 and the third protective line 310 and a capacitive coupling component formed between the signal transmission line 100 and the fourth protective line 320 is divided by the first and second protective lines 230 and 240, respectively.

In more detail, the first protective line 230 divides the capacitive coupling component between the third protective line 310 and the signal transmission line 100 into two parts, whereas the second protective line 240 divides the capacitive coupling component between the fourth protective line 320 and the signal transmission line 100 into two parts.

A ground voltage VSS may be provided to the third and fourth protective lines 310 and 320 in order to electrically isolate the signal transmission line 100 from neighboring signal transmission lines.

The capacitive coupling component may be determined according to a difference in voltage between the signal transmission line 100 and the third and fourth protective lines 310 and 320 while the first and second protective lines 230 and 240 divide the capacitive coupling components among the signal transmission line 100 and the third and fourth protective lines 310 and 320 in half. Therefore, the capacitive coupling components of the signal transmission line 100 may be reduced.

The semiconductor device, according to an embodiment, reduces the capacitive coupling components which has a negative influence on the signal transmission line 100 resulting in an increase of a signal slope in which a signal transferred along the signal transmission line 100 has a normal value. As a result, a transfer speed and reliability of a signal transferred through the signal transmission line 100 can be improved.

In accordance with another embodiment, the first and second protective lines 230 and 240 may extend in the same direction as the extension direction of the signal transmission line 100 (e.g., the Y direction) whereas the third and fourth protective lines 310 and 320 may be formed to extend in substantially the same direction as the extension direction of the signal transmission line but may instead of being continuous elongated lines, they may have an intermittent pattern. Hence, in a variation of the illustrated embodiment of FIG. 2, the third and fourth protective lines 310 and 320 may each include a plurality of individual, elongated, separate elements as, for example, the first and second protective elements 211 to 215 and 221 to 225 of the embodiment of FIG. 1.

Referring now again to the embodiment of FIG. 2, the first protective line 230 includes a plurality of first protective line elements 231 to 235 forming a first intermittent pattern. Also, the second protective line 240 includes a plurality of second protective line elements 241 to 245 forming a second intermittent pattern. The length of the first intermittent pattern is identical to the length of the second intermittent pattern. For example, each of the first protective line elements 231 to 235 contained in the first protective line 230 has a length l1 in the Y-axis direction. Likewise, each of the second protective line elements 241 to 245 contained in the second protective line 240 has a length l1. In addition, the gaps between two individual, successive first protective elements (e.g., between elements 231 and 233, or between elements 233 and 235) are of the same length to the length of the gaps between two individual, successive second protective elements (e.g., between elements 241 and 243, or between elements 243 and 245). However, we note that the invention is not limited to such an embodiment. For example, the gaps between two individual, successive first protective elements may be of different length. For example, the gap between elements 231 and 233, may be different from the gap between elements 233 and 235. Likewise, the length of the gaps between two individual, successive second protective elements may be different. For example, the gap between elements 241 and 243, may be different form the gap between 243 and 245.

Each group of the first and second protective line elements 231 to 235 and 241 to 245 may be spaced apart from the signal transmission line 100 by a predetermined distance "d" in the X-axis direction.

Figure 3:
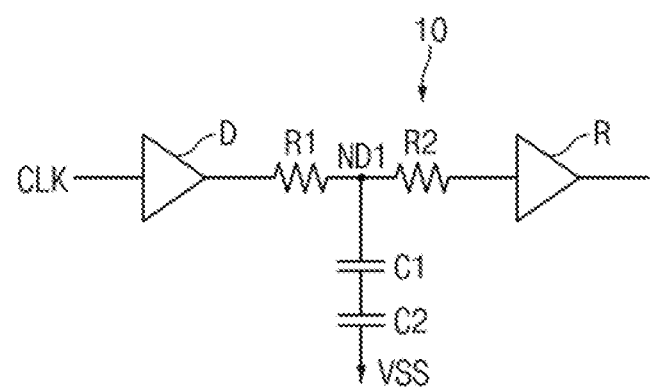
FIG. 3 is a circuit diagram illustrating an equivalent circuit of the semiconductor device of FIG. 2.

The capacitive coupling component C1 of FIG. 3 between the signal transmission line 100 and the first and second protective line elements 231 to 235 and 241 to 245 may be adjusted through the length l1 of each of the first and second protective line elements 231 to 235 and 241 to 245 and the separation distance "d" between the signal transmission line 100 and each group of the first and second protective line elements 231 to 235 and 241 to 245. As a result, the magnitude of total capacitive coupling component coupled to the signal transmission line 100 may also be adjusted.

Although the first protective line elements 231 to 235 contained in the first protective line 230 and the second protective line elements 241 to 245 contained in the second protective line 240 are shown in the form of a pattern having substantially the total same length for convenience of description and better understanding of the present disclosure, the scope or spirit of the present disclosure is not limited thereto. For example, the total length of the first protective line elements 231 to 235 may be shorter in length than the second protective line 310. Likewise, the total length of the second protective line elements 241 to 245 may be shorter in length than the second protective line 320.

FIG. 3 is a circuit diagram illustrating an equivalent circuit of the semiconductor device 10b of FIG. 2.

Referring to FIG. 3, the semiconductor device 10 is configured to provide a clock signal CLK through the signal transmission line. For example, the clock signal CLK may be provided through a driver D, and may be received through a receiver R, as illustrated in FIG. 3.

The semiconductor device 10 may include resistance components R1 and R2 of the signal transmission line 100. The first and second capacitive coupling components C1 and C2, which are formed, respectively, between the signal transmission line 100 and the first and second protective lines 230 and 240, and between the third and fourth protective line 310 and 320 and the first and second protective lines 210 and 220, may be coupled in series to the first node ND1.

Since the capacitive coupling components C1 and C2 are coupled in series to each other, the equivalent capacitive coupling magnitude Ct coupled to the signal transmission line 100 may be represented by the following equation 1.

$$C_t = \frac{C_1 \times C_2}{C_1 + C_2} \qquad \text{[Equation 1]}$$

As described above, the capacitive coupling component formed between the signal transmission line 100 and the third and fourth protective lines 310 and 320 is divided into two capacitive coupling components by the first and second protective lines 230 and 240. Since the first and second capacitive coupling components C1 and C2 are coupled in series to each other, the equivalent capacitive coupling magnitude may be greatly reduced as compared to the case in which the above-mentioned capacitive coupling component is not divided into two capacitive coupling components C1 and C2.

For example, assuming that the first capacitive coupling component C1 and the second capacitive coupling component C2 have the same magnitude, the equivalent capacitive coupling magnitude corresponds to half the first capacitive coupling component C1, so that the total capacitive coupling magnitude can be reduced by at least a half.

Figure 4:
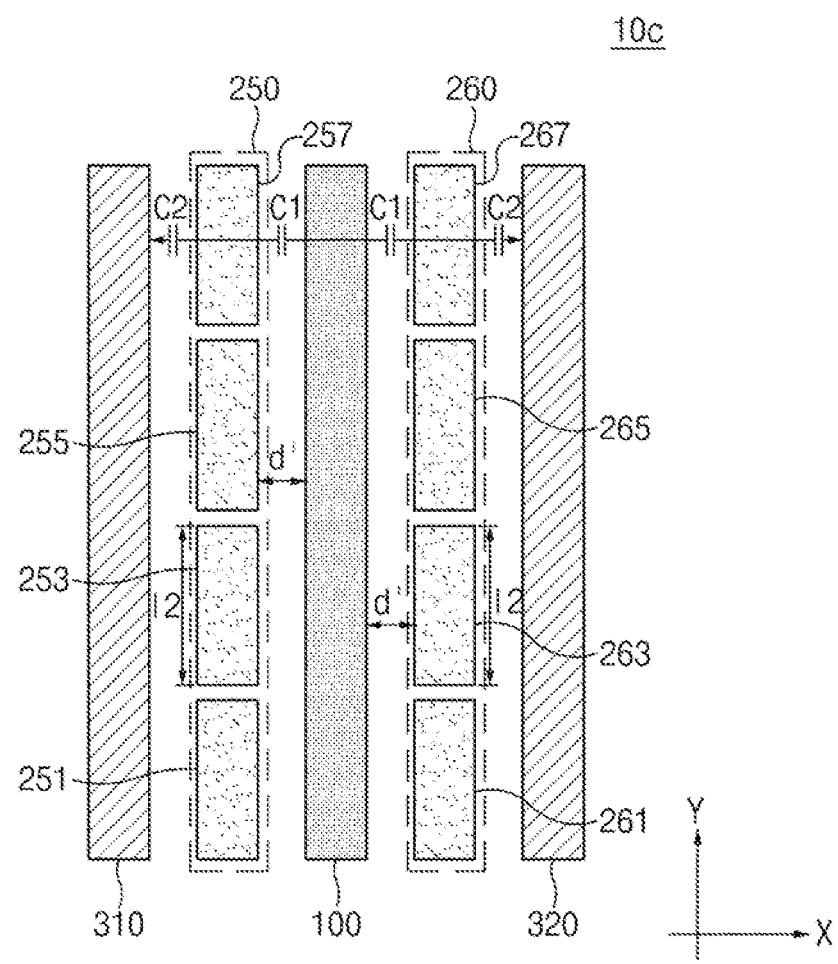

FIG. 4 is a plan view illustrating a semiconductor device, according to yet another embodiment of the present disclosure.

Referring to FIG. 4, each length l2 of the first and second protective line elements 251 to 257 and 261 to 267, respectively constructing first and second protective lines 250 and 260 contained in the semiconductor device 10c is extended in the Y-axis direction. The Y-directional length l1 of the respective first and second protective line elements 231 to 235 and 241 to 245 contained in the semiconductor device 10b of FIG. 2 may be longer than the Y-directional length l2 of the respective first and second protective line elements 251 to 257 and 261 to 267.

As the Y-directional length l2 of the respective first and second protective line elements 251 to 257 and 261 to 267 becomes shorter, the capacitance of the capacitive coupling component between the signal transmission line 100 and the first and second protective line elements 251 to 257 and 261 to 267 may become smaller in proportion to the length.

That is, as the respective first and second protective line elements 251 to 257 and 261 to 267 becomes reduced in length, the capacitances C1 and C2 of the first and second capacitive coupling components in the equivalent circuit of FIG. 3 also become smaller because the capacitance is proportional to the length l2 of a conductive component (i.e., a cross-sectional area formed when the respective first and second protective line elements 251 to 257 and 261 to 267 face each other).

Therefore, the capacitance of the capacitive coupling component applied to the signal transmission line 100 of the semiconductor device 10c of FIG. 4 may be smaller than the capacitive coupling component magnitude coupled to the signal transmission line 100 of the semiconductor device 10b of FIG. 2.

In accordance with the embodiment of FIG. 4, the first and second protective line elements 251 to 257 and 261 to 267 are spaced apart from the signal transmission line 100 by a predetermined distance "d'" in the X-axis direction. As described above, since the capacitance is inversely proportional to the distance between two conductive lines, the capacitance of the capacitive coupling component is reduced in proportion to the increasing distance "d'" between the two conductive lines.

Figure 5:
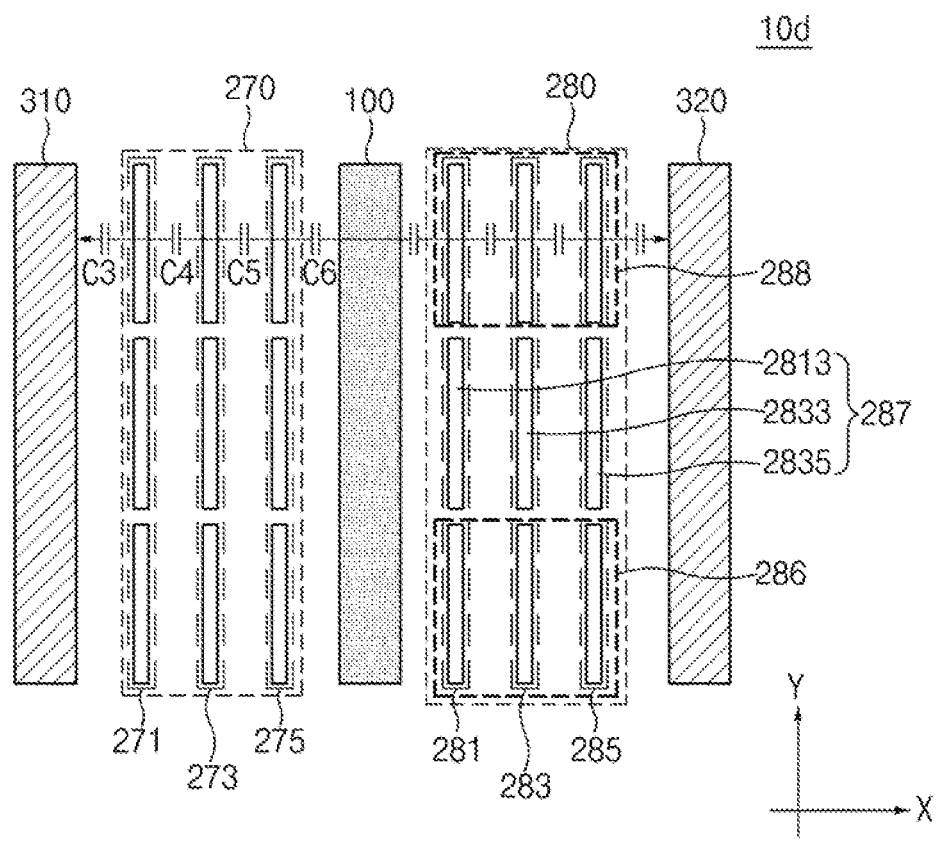

FIG. 5 is a plan view illustrating a semiconductor device, according to yet another embodiment of the present disclosure.

Referring to FIG. 5, the semiconductor device 10d may include first and second protective lines 270 and 280. Each of the first and second protective lines 270 and 280 includes a plurality of divided, intermittent, protective lines 271 to 275 and 281 to 285, respectively. The plurality of divided, intermittent, protective lines 271 to 275 and 281 to 285 of the respective first and second protective lines 270 and 280 are extending in the Y-axis direction (in parallel to one another) and are spaced apart from the signal transmission line 100 along the X-axis at a regular predetermined interval.

Since the plurality of divided, intermittent, protective lines 271 to 275 and 281 to 285 of the respective first and second protective lines 270 and 280 are spaced apart from one another by a predetermined distance in the X-axis direction, the signal transmission line 100 may have the capacitance equivalent to serial capacitances C3 to C6 among the signal transmission line 100, the plurality of the divided protective lines 271 to 275 and 281 to 285 of the respective first and second protective lines 270 and 280, and the third and fourth protective lines 310 and 320. For example, the semiconductor device 10d may form four capacitive coupling components C3 to C6 through the signal transmission line 100, the first protective line 270 and the third protective line 310, and may form four capacitive coupling components C3 to C6 through the signal transmission line 100, the second protective line 280 and the fourth protective line 320. Therefore, assuming that the capacitive coupling component divided by the plurality of divided protective lines 271 to 275 and the capacitive coupling component divided by the plurality of the divided protective lines 281 to 285 have the same values, the equivalent capacitance can be further reduced by half as compared to the semiconductor device 10b of FIG. 2.

Each of the plurality of divided protective lines 271 to 275 and 281 to 285 may be intermittently extended in the Y-axis direction, with the length extended in the Y-axis direction changed in different ways according to the capacitive coupling component values as shown in FIGS. 2 and 4.

From a different standpoint of the arrangement structure of the semiconductor device 10d, the plurality of the divided protective lines 281 to 285 include a plurality of protective line elements 286 to 288 intermittently extended in the Y-axis direction in the same manner as in the semiconductor devices 10b and 10c of FIGS. 2 and 4, and each of the protective line elements 286 to 288 includes several (e.g., three) divided protective line elements 2813 to 2853 that are spaced apart from one another by a predetermined distance in the X-axis direction while arranged in parallel to one another. The plurality of divided protective lines 271 to 275 may have substantially the same structure as the plurality of the divided protective lines 281 to 285.

The semiconductor device according to an embodiment (not shown), may further include a floated protective line disposed between the signal transmission line 100 and the third and fourth protective lines 310 and 320. The floated protective line can reduce the capacitance between the signal transmission line 100 and the third and fourth protective lines 310 and 320 by half or less. As the length of a specific region in which the floated protective line and the signal transmission line 100 face each other is reduced, the capacitance directly affecting the signal transmission line 100 can be minimized.

As is apparent from the above description, the semiconductor device, according to embodiments of the present invention, may include a plurality of protective lines located in the vicinity of an electrical line, such as, for example, a signal transmission line configured to transmit a significant signal, so that the loading capacitive coupling between adjacent electrical lines can be minimized.

The semiconductor device, according to embodiments of the present invention, can minimize capacitive coupling between adjacent electrical lines even when the distance between the signal transmission lines is reduced, so that the semiconductor device is appropriate for signal transmission of a small-sized, high integrity device.

Those skilled in the art will appreciate that embodiments of the present disclosure may be carried out in other ways than those set forth herein without departing from the spirit and essential characteristics of these embodiments. The above embodiments are therefore to be construed in all aspects as illustrative and not restrictive.

The above embodiments of the present disclosure are illustrative and not limitative. Various alternatives and equivalents are possible. The invention is not limited by the type of deposition, etching polishing, and patterning steps described herein. Nor is the invention limited to any specific type of semiconductor device. For example, the present disclosure may, for example, be implemented in a dynamic random access memory (DRAM) device or a nonvolatile memory device. Other additions, subtractions, or modifications which are obvious in view of the present disclosure are intended to fall within the scope of the appended claims.

What is claimed is:
1. A semiconductor device comprising:
  a signal transmission line extending in a first direction;
  a first outer protective line and a second outer protective line extending in a substantially identical direction as the first direction, spaced apart from the signal transmission line by a predetermined distance along a second direction which is substantially perpendicular to the first direction and symmetrically disposed on both sides of the signal transmission line;
  a first inner protective line, disposed between the first outer protective line and the signal transmission line, and intermittently extending substantially in parallel with the signal transmission line and the first outer protective line; and
  a second inner protective line, disposed between the second outer protective line and the signal transmission line, and intermittently extending substantially in parallel with the signal transmission line and the second outer protective line.

2. The semiconductor device according to claim 1, wherein the first inner protective line and the second inner protective line are spaced apart from the signal transmission line by a predetermined distance.

3. The semiconductor device according to claim 1, wherein the first outer protective line and the second outer protective line receive a ground voltage.

4. The semiconductor device according to claim 3, wherein the first inner protective line and the second inner protective line are in a floating state.

5. The semiconductor device according to claim 4, wherein the first inner protective line and the second inner protective line are shorter than the first inner protective line and the second inner protective line, respectively.

6. The semiconductor device according to claim 4, wherein the first inner protective line and the second inner protective line include a plurality of inner protective line elements each having a predetermined length in the first direction.

7. The semiconductor device according to claim 4, wherein the first inner protective line and the second inner protective line include one or more divided, intermittent protective lines each extending in parallel in the first direction and spaced apart at a regular interval along the second.

8. The semiconductor device according to claim 4, wherein the signal transmission line receives at least one of a clock signal and a data signal.

* * * * *